(12) United States Patent
Cho

(10) Patent No.: US 6,760,090 B2
(45) Date of Patent: Jul. 6, 2004

(54) LIQUID CRYSTAL DISPLAY DEVICE HAVING SOLDER RESIST STRUCTURE AND METHOD OF MAKING THE SAME

(75) Inventor: Hyoung Soo Cho, Kyoungsangbuk-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 55 days.

(21) Appl. No.: 10/157,206

(22) Filed: May 30, 2002

(65) Prior Publication Data

US 2003/0067576 A1 Apr. 10, 2003

(30) Foreign Application Priority Data

Oct. 10, 2001 (KR) .................................... P2001-62422

(51) Int. Cl.[7] ............................................ G02F 1/1345
(52) U.S. Cl. ...................... 349/150; 349/149; 349/151; 349/152
(58) Field of Search ................... 349/149–152

(56) References Cited

U.S. PATENT DOCUMENTS

| | | | | |
|---|---|---|---|---|
| 5,478,006 A | * | 12/1995 | Taguchi | 228/180.21 |
| 5,936,850 A | * | 8/1999 | Takahashi et al. | 361/784 |
| 5,949,512 A | * | 9/1999 | Taguchi | 349/150 |
| 6,556,268 B1 | * | 4/2003 | Lee et al. | 349/149 |
| 2002/0135727 A1 | * | 9/2002 | Nakaminami et al. | 349/149 |

* cited by examiner

*Primary Examiner*—Tarifur R. Chowdhury
(74) *Attorney, Agent, or Firm*—Morgan Lewis & Bockius LLP

(57) ABSTRACT

A liquid crystal display includes a liquid crystal panel having a plurality of pads, a printed circuit board, a tape carrier package electrically interconnecting the liquid crystal panel and the printed circuit board, an electrode lead portion formed on a rear surface of the tape carrier package, an anisotropic conductive film connected to at least one of the plurality of pads of the liquid crystal panel and formed at a first side of the electrode lead portion, and a solder resist formed at a second side of the electrode lead portion and contacting the anisotropic conductive film.

20 Claims, 6 Drawing Sheets

CONDUCTIVE IMPURITIES

LIQUID CRYSTAL DISPLAY DEVICE HAVING SOLDER RESIST STRUCTURE AND METHOD OF MAKING THE SAME

The present invention claims the benefit of Korean Patent Application No. P2001-62422 filed in Korea on Oct. 10, 2001, which is hereby incorporated by reference.

BACKGROUND OF THE INVENTION

1. Field of the Invention

The present invention relates to a liquid crystal display device and a method of making a liquid crystal display device, and more particularly to a liquid crystal display device that prevents an electrical short circuit between electrodes that are formed on a tape carrier package.

2. Discussion of the Related Art

In general, a liquid crystal display (LCD) device of an active matrix driving system uses thin film transistors (TFT's) as switching devices to display image data as natural moving pictures. Such an LCD is commonly used for a monitor of a portable television or a laptop personal computer, for example, because of its small size as compared to a Brown tube device.

The active matrix liquid crystal display (LCD) device displays an image corresponding to a video signal on a pixel matrix (or picture element matrix) having pixels arranged at each intersections between gate lines and data lines. Each pixel includes a liquid crystal cell for controlling a quantity of light transmitted in accordance with a data signal voltage level transmitted along a data line. At least one of the TFT's is disposed at the intersection between the gate line and the data line in order to supply the data signal voltage level to the liquid crystal cell in response to a scanning signal that is transmitted along the gate line. Accordingly, such a liquid crystal display (LCD) requires a plurality of Driving Integrated Circuits (D-IC) for supplying data signals and scanning signals to the data and gate lines, respectively. The D-IC's are installed between a Printed Circuit Board (PCB) and a liquid crystal panel. The D-IC's respond to control signals received from the PCB, and supplies the data signals and the scanning signals to the data lines and the gate lines of the liquid crystal panel. Tape Automated Bonding (TAB) is a common method used for mounting the D-IC's where an effective area of the liquid crystal panel may be increased, thereby simplifying the mounting process of the D-IC's.

FIG. 1 is a cross sectional view showing a liquid crystal display device according to the conventional art. In FIG. 1, the liquid crystal display device includes a tape carrier package (TCP) 18 interconnected between a liquid crystal panel 11 and a PCB 24, a D-IC (not shown) is mounted on the TCP 18 by a TAP method, and an anisotropic conductive film (ACF) 20 that attaches the TCP 18 onto the liquid crystal panel 11.

The liquid crystal panel 11 includes an upper substrate 10 upon which a Color Filter Array (not shown) and an alignment film (not shown) are sequentially formed, a lower substrate 12 on which a TFT array (not shown) and an alignment film (not shown) are sequentially formed, and polarizing plates 14 and 16 sandwiching the upper substrate 10 and the lower substrate 12. The lower substrate 12 of the liquid crystal panel 11 is attached to the TCP 18 by the ACF 20 under high temperature and high pressure, and is connected to the PCB 24.

The D-IC (not shown) generates a driving signal in accordance with the control signal received from the PCB 24. An electrode lead portion 26 of the TCP 18 is formed on a rear surface of the TCP 18, and supplies the driving signal generated by the D-IC to the liquid crystal panel 11. The PCB 24 is electrically connected to the liquid crystal panel 11 by an electrode lead portion 26. One end region of the electrode lead portion 26 attached to the ACF 20 on a pad portion of the lower substrate 12, and a second end region of the electrode lead portion 26 is soldered to the POB 24. A solder resist 28 is formed on the electrode lead portion 26 for protection.

FIGS. 2A to 2C show a process for fabricating a liquid crystal display device according to the conventional art. In FIG. 2A, liquid crystal material is injected between the upper substrate 10 and the lower substrate 12, and the upper substrate and the lower substrate are attached together. Then, polarizing plates 14 and 16 are attached to outside surfaces of the upper substrate 10 and the lower substrate 12, thereby completing the liquid crystal display device. In addition, edge portions of the lower substrate 12 are ground in order to prevent any damaged during a grinding process.

In FIG. 2B, the ACF 20 is formed upon the lower substrate 12 of the liquid crystal panel 11.

In FIG. 2C, the TCP 18 is formed upon the ACF 20. The electrode lead portion 26 is electrically interconnected between the liquid crystal panel 11 with the PCB (24 in FIG. 1) on the rear surface of the TCP 18. Then, the solder resist 28 is formed at one end region of the electrode lead portion 26. The solder resist 28 protects exposed regions of the electrode lead portion 26 formed at one side region of the rear surface of the TCP 18. Accordingly, since the solder resist 28 is only formed in a region of the electrode lead portion 26, an exposed area is created between the lower substrate 12 and the PCB 24 (in FIG. 1).

FIG. 3 is a photograph showing an electrode lead portion of a tape carrier package shown in FIG. 1 according to the conventional art. In FIG. 3, the exposed area created between the lower substrate 12 and the PCB 24 (in FIG. 1) is shown between the solder resist (S/R) 28 area and an adhesion area of the ACF 20. Accordingly, when attaching the liquid crystal panel 11 to a top case (not shown) using a screw fastener, any metal impurities generated as a result of boring a pilot hole for the screw fastener in top case contaminate the exposed electrode lead portion 26. Therefore, each electrode may electrically short circuit because of the contaminating metal impurities.

SUMMARY OF THE INVENTION

Accordingly, the present invention is directed to a liquid crystal display device and a method of making a liquid crystal display device that substantially obviates one or more of the problems due to limitations and disadvantages of the related art.

An object of the present invention is to provide a liquid crystal display that prevents an electrical short circuit between electrodes formed on a tape carrier package.

Additional features and advantages of the invention will be set forth in the description which follows, and in part will be apparent from the description, or may be learned by practice of the invention. The objective and other advantages of the invention will be realized and attained by the structure particularly pointed out in the written description hereof as well as the appended drawings.

To achieve these and other advantages and in accordance with the purposes of the present invention, as embodied and broadly described, a liquid crystal display a liquid crystal display includes a liquid crystal panel having a plurality of pads, a printed circuit board, a tape carrier package electrically interconnecting the liquid crystal panel and the printed circuit board, an electrode lead portion formed on a rear surface of the tape carrier package, an anisotropic conductive film connected to at least one of the plurality of pads of the liquid crystal panel and formed at a first side of the electrode lead portion, and a solder resist formed at a second side of the electrode lead portion and contacting the anisotropic conductive film.

In another aspect, a method for fabricating a liquid crystal display includes interconnecting a liquid crystal panel and a printed circuit board via a tape carrier package, forming an anisotropic conductive film on at least one of a plurality of pads of the liquid crystal panel and at a first side of an electrode lead portion formed on a rear surface of the tape carrier package, and forming a solder resist at a second side of the electrode lead portion to contact the anisotropic conductive film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
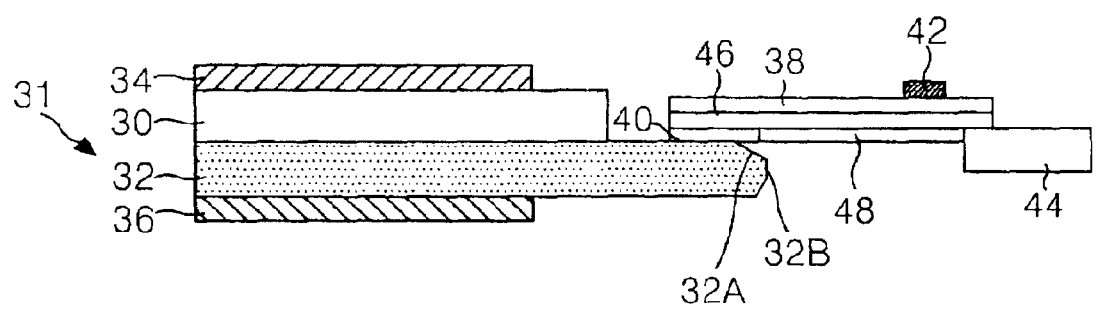
FIG. 4 is a sectional view showing an exemplary liquid crystal display according to the present invention.

FIG. 4 is a sectional view showing an exemplary liquid crystal display according to the present invention. In FIG. 4, a liquid crystal display device may include a TCP 38 interconnected between a liquid crystal panel 31 and a PCB 44, a D-IC 42 that may be mounted upon the TCP 38, an ACF 40 attaching the TCP 38 to the liquid crystal panel 31, and a solder resist 48 protecting the electrode lead portion 46 of the TCP 38.

The liquid crystal panel 31 may include an upper substrate 30 on which a color filter array (not shown) and an alignment film (not shown) may be sequentially formed, a lower substrate 32 on which a TFT array (not shown) and an alignment film (not shown) may be formed, liquid crystal material (not shown) injected between the upper substrate 30 and the lower substrate 32, and polarizing plates 34 and 36 sandwiching the upper substrate 30 and the lower substrate 32. The lower substrate 32 of the liquid crystal panel 31 may be attached to the TCP 38 by the ACF 40 under high temperature and high pressure, and may be connected to the PCB 44.

The D-IC 42 may generate a driving signal in accordance with a control signal received from the PCB 44. An electrode lead portion 46 may be formed at one side of a rear surface of the TCP 38, thereby supplying a driving signal generated from the D-IC 42 to the liquid crystal panel 31. A first region of the electrode lead portion 46 formed upon the TCP 38 may be soldered to the PCB 44 and electrically interconnect the PCB 44 and the liquid crystal panel 31. A second region of the electrode lead portion 46 may be attached to the ACF 40 that is formed on a pad portion of the lower substrate 32.

The lower substrate 32 may undergo a grinding process to prevent damage to an edge part of the lower substrate 32. During the grinding process, an edge region of the lower substrate 32 may be ground. Accordingly, a vacant space bound by an inclined surface 32A of the lower substrate 32 may be formed between the lower substrate 32 and the TCP 38.

A solder resist 48 may be formed at a first side of the electrode lead portion 46 to extend by about 0.1 mm from an end region 32B of the lower substrate 32 along a direction of the lower substrate 32. At the same time, the ACF 40 may be formed at a second side of the electrode lead portion 46 to extend by about 0.2 mm overhanging the inclined surface 32A of the lower substrate 32 along a direction of the PCB 44.

The ACF 40 may be melted to adhere to the electrode lead portion 46 of the TCP 38. Accordingly, the electrode lead portion 46 of the TCP 38 is not exposed, thereby protecting the electrode lead portion 46.

Figure 1:
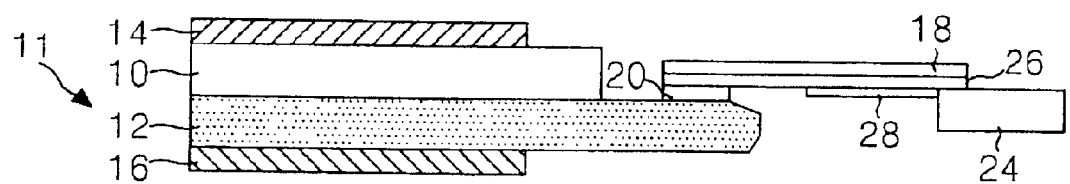
FIG. 1 is a cross sectional view showing a liquid crystal display device according to the conventional art.
Figure 2A:
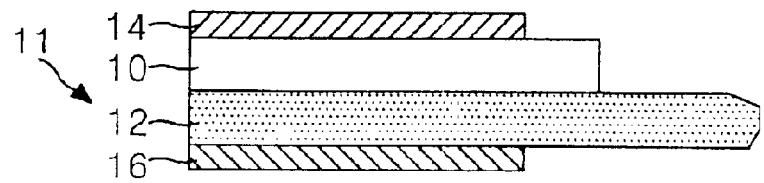
FIGS. 2A to 2C are cross sectional views showing a process for fabricating the liquid crystal display shown in FIG. 1 according to the conventional art.
Figure 2B:
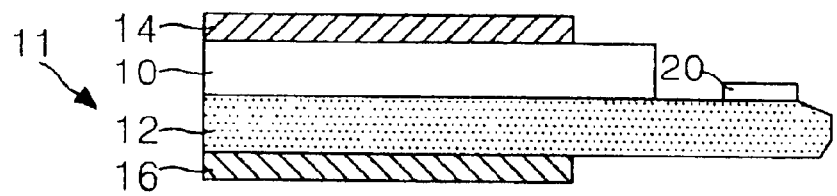
Figure 2C:
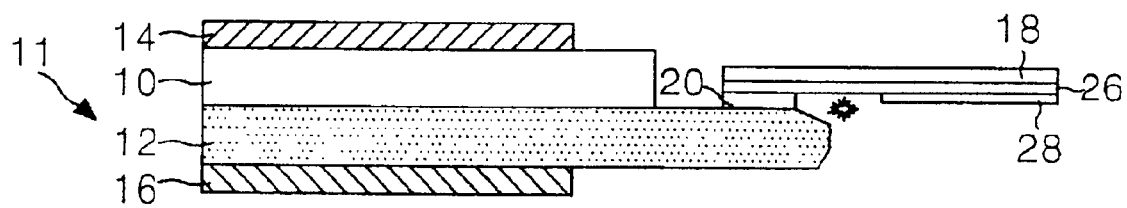
Figure 3:
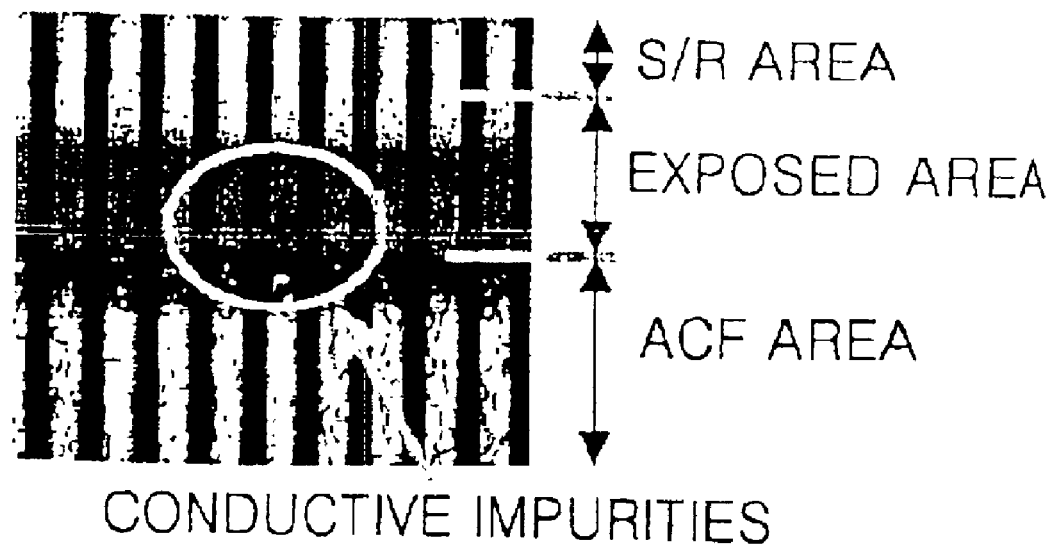
FIG. 3 is a photograph showing an electrode lead portion of a tape carrier package shown in FIG. 1 according to the conventional art.
Figure 5A:
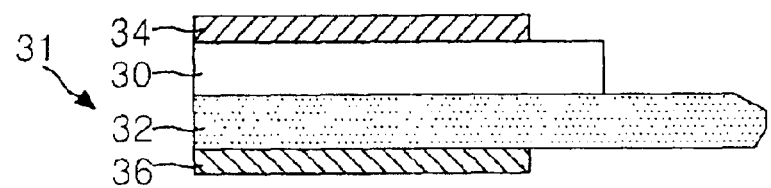
FIGS. 5A to 5C are sectional views showing an exemplary fabrication method of the liquid crystal display shown in FIG. 3 according to the present invention.
Figure 5B:
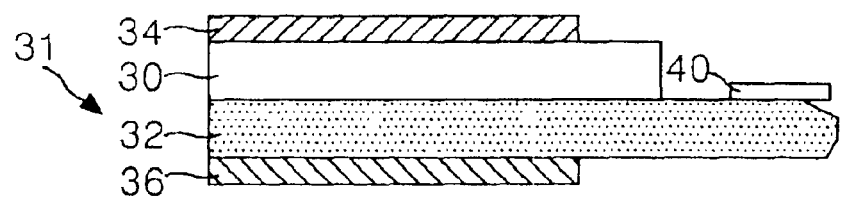
Figure 5C:
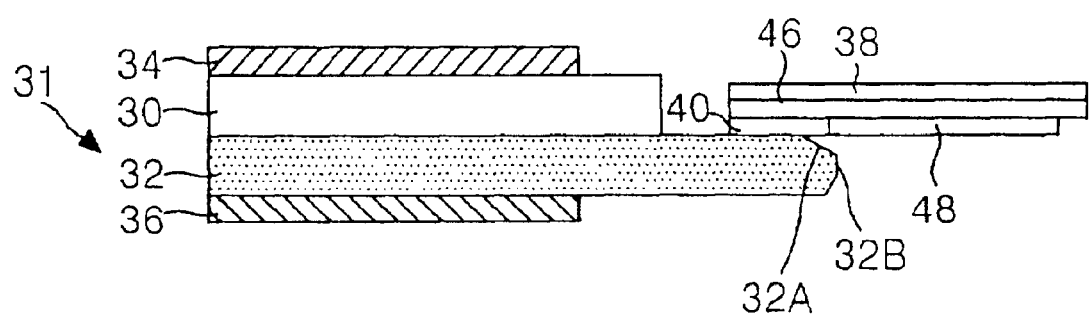

FIGS. 5A to 5C are sectional views showing an exemplary fabrication method of the liquid crystal display shown in FIG. 3 according to the present invention. In FIG. 5A, a liquid crystal material may be injected, for example, between the upper substrate 30 and the lower substrate 32, and the upper substrate 30 and the lower substrate 32 may be attached together. Then, the polarizing plates 34 and 36 may be attached to outer surfaces of the upper substrate 30 and the lower substrate 32, thereby completing the liquid crystal display device. In addition, edge regions of the lower substrate 32 may be ground by a grinding process, for example.

In FIG. 5B, the ACF 40 may be formed upon the lower substrate 32 of the liquid crystal panel 31. The ACF 40 attaches the TCP 38 to pads formed on the lower substrate 32.

In FIG. 5C, the ACF 40 is attached to a first region of the electrode lead portion 46 of the TCP 38, and the solder resist 48 is formed on a second region of the electrode lead portion 46. The ACF 40 extends by about 0.2 mm along a direction of the PCB (44 in FIG. 4) to overhang the inclined surface 32A of the lower substrate 32. At the same time, the solder resist 48 extends by about 0.1 mm from the end region 32B of the lower substrate 32 toward the PCB (44 in FIG. 4).

Figure 6:
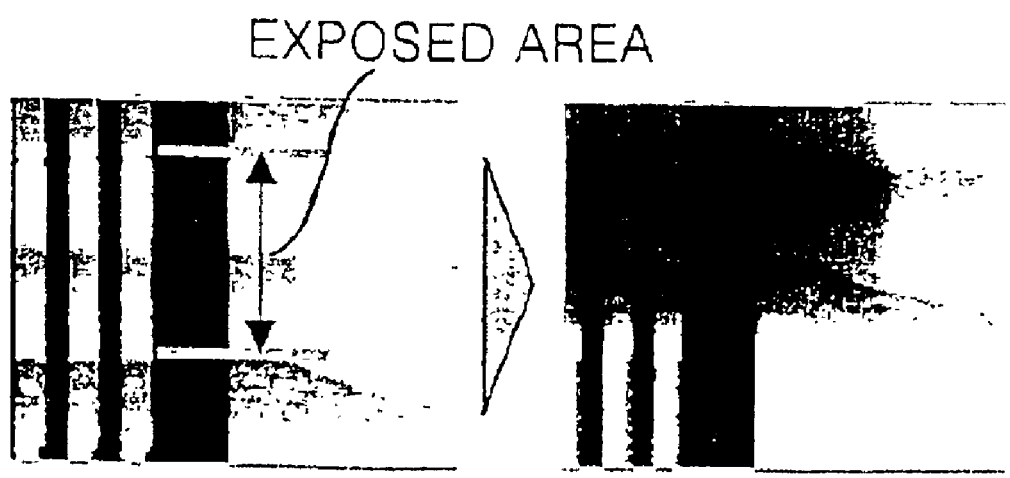
FIG. 6 is a photograph of an exemplary electrode lead portion of a tape carrier package shown in FIG. 4 according to the present invention.

FIG. 6 is a photograph of an exemplary electrode lead portion of a tape carrier package shown in FIG. 4 according to the present invention. In FIG. 6, the electrode lead portion 46 formed at the rear surface of the TCP 38 is protected by the ACF 40 and the solder resist 48. Accordingly, since the electrode lead portion 46 of the TCP 38 is not exposed to impurities, an electrical short circuit between electrodes can be prevented from occurring by contacting the impurities.

It will be apparent to those skilled in the art that various modifications and variations can be made in the liquid crystal display device and method of making a liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a liquid crystal panel having a plurality of pads;
   a printed circuit board;
   a tape carrier package electrically interconnecting the liquid crystal panel and the printed circuit board;
   an electrode lead portion formed on a rear surface of the tape carrier package;
   an anisotropic conductive film connected to at least one of the plurality of pads of the liquid crystal panel and formed at a first side of the electrode lead portion; and
   a solder resist formed at a second side of the electrode lead portion and contacting the anisotropic conductive film.

2. The liquid crystal display according to claim 1, wherein the liquid crystal panel includes an upper substrate and a lower substrate facing the upper substrate.

3. The liquid crystal display according to claim 2, wherein at least one edge of the lower substrate has an inclined surface formed by a grinding process.

4. The liquid crystal display according to claim 3, wherein the anisotropic conductive film extends about 0.1–0.2 mm from a point where the inclined surface of the lower substrate contacts the anisotropic conductive film along a direction of the printed circuit board.

5. The liquid crystal display according to claim 3, wherein the solder resist extends about 0.1–0.2 mm from an end of the lower substrate along a direction of the liquid crystal panel.

6. The liquid crystal display according to claim 1, further includes a driving circuit for supplying a driving signal to the liquid crystal panel.

7. The liquid crystal display according to claim 6, wherein the driving circuit is disposed between the printed circuit board and the tape carrier package.

8. The liquid crystal display according to claim 1, wherein upper surfaces of the printed circuit board, the plurality of pads, and the solder resist are within a same plane.

9. The liquid crystal display according to claim 1, wherein the electrode lead portion contacts a first surface of the printed circuit board and the solder resist contacts a second surface of the printed circuit board adjacent to the first surface.

10. The liquid crystal display according to claim 1, wherein the solder resist includes a first end portion contacting a side region of at least one of the plurality of pads and a second end portion contacting a side region of the printed circuit board.

11. A method for fabricating a liquid crystal display, comprising:
    interconnecting a liquid crystal panel and a printed circuit board via a tape carrier package;
    forming an anisotropic conductive film on at least one of a plurality of pads of the liquid crystal panel and at a first side of an electrode lead portion formed on a rear surface of the tape carrier package; and
    forming a solder resist at a second side of the electrode lead portion to contact the anisotropic conductive film.

12. The method according to claim 11, wherein the liquid crystal panel includes an upper substrate and a lower substrate facing the upper substrate.

13. The method according to claim 12, wherein at least one edge of the lower substrate has an inclined surface formed by a grinding process.

14. The method according to claim 13, wherein the anisotropic conductive film extends about 0.1–0.2 mm from a point where the inclined surface of the lower substrate contacts the anisotropic conductive film along a direction of the printed circuit board.

15. The method according to claim 13, wherein the solder resist extends about 0.1–0.2 mm from an end of the lower substrate along a direction of the liquid crystal panel.

16. The method according to claim 11, further including a step of providing a driving circuit for supplying a driving signal to the liquid crystal panel.

17. The method according to claim 16, wherein the driving circuit is provided between the printed circuit board and the tape carrier package.

18. The method according to claim 11, wherein upper surfaces of the printed circuit board, the plurality of pads, and the solder resist are within a same plane.

19. The method according to claim 11, wherein the electrode lead portion contacts a first surface of the printed circuit board and the solder resist contacts a second surface of the printed circuit board adjacent the first surface.

20. The method according to claim 11, wherein the solder resist includes a first end portion contacting a side region of at least one of the plurality of pads and a second end portion contacting a side region of the printed circuit board.

* * * * *